US 6,680,774 B1

(12) United States Patent
Heinle

(10) Patent No.: US 6,680,774 B1
(45) Date of Patent: Jan. 20, 2004

(54) METHOD AND APPARATUS FOR MECHANICALLY MASKING A WORKPIECE

(75) Inventor: Konrad Heinle, Santa Clara, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/973,790

(22) Filed: Oct. 9, 2001

(51) Int. Cl.[7] .......................... G03B 27/58; G03B 27/42
(52) U.S. Cl. ................................ 355/72; 355/53
(58) Field of Search .................. 355/53, 67, 72–77; 414/225, 321, 749

(56) References Cited

U.S. PATENT DOCUMENTS

| 4,904,012 A | * | 2/1990 | Nishiguchi et al. ........ 294/64.1 |
| 5,361,121 A | * | 11/1994 | Hattori et al. ................ 355/50 |
| 5,760,881 A | * | 6/1998 | Miyazaki et al. ............. 355/71 |
| 6,078,381 A | * | 6/2000 | Suzuki ........................ 355/53 |

FOREIGN PATENT DOCUMENTS

JP 05335207 A * 12/1993

* cited by examiner

Primary Examiner—Henry Hung Nguyen
(74) Attorney, Agent, or Firm—Allston L. Jones

(57) ABSTRACT

A method of, and apparatus for, mechanically masking a workpiece to form exposure exclusion regions is disclosed. The apparatus includes a mask that is arranged atop the photosensitive surface of the workpiece. The mask is opaque to the wavelength of radiation that activates the photosensitive workpiece surface. The mask is placed onto the workpiece prior to lithographic exposure of the workpiece so that the photosensitive material (e.g., negative acting photoresist) can be removed from select regions of the workpiece to provide, for example, electrical contact directly to the workpiece upper surface.

16 Claims, 6 Drawing Sheets

METHOD AND APPARATUS FOR MECHANICALLY MASKING A WORKPIECE

CROSS REFERENCE

This patent application is related to pending U.S. patent application Ser. No. 09/974,196 entitled "METHOD AND APPARATUS FOR OPTICALLY DEFINING AN EXPOSURE EXCLUSION REGION ON A PHOTOSENSITIVE WORKPIECE" filed on Oct. 9, 2001, and pending U.S. patent application Ser. No. 09/923,755, entitled "METHOD AND APPARATUS FOR MASKING A WORKPIECE WITH INK" filed on Aug. 6, 2001.

BACKGROUND OF THE INVENTION

1. Field of the Invention

The present invention relates to the lithographic exposure and patterning of workpieces, and in particular relates to a mechanical method and apparatus for selectively masking a workpiece to prevent exposure of select regions on the workpiece.

2. Description of the Prior Art

Lithography techniques are used in the manufacturing of microdevices, such as integrated circuits (ICs), flat panel displays, microelectromechanical systems (MEMS), the formation of bump IC interconnects for "flip chip" interconnection technology, and the like. The lithographic process involves the use of photosensitive workpieces ("wafers") and the selective exposure of such workpieces with radiation (e.g., UV light). Workpiece photosensitivity is typically achieved by coating or otherwise applying a layer of photosensitive material called photoresist to the workpiece surface. Photoresist can either be "positive-tone" in which the exposed resist is removed upon developing, or "negative-tone" in which the unexposed resist is removed upon developing.

Generally, the lithography process includes the steps of coating the workpiece with photoresist, exposing the photoresist with the image of a mask to form a latent pattern in the photoresist, developing the photoresist to form a three dimensional image, etching the photoresist to form a corresponding three dimensional pattern in the workpiece, and then removing the excess photoresist. These steps are repeated a requisite number of times to form the particular device structure in the workpiece.

In certain lithography applications involving negative photoresist, it is preferred that select regions of the workpiece outside of the individual exposure fields remain completely unexposed so that the resist in these regions is removed upon developing. One example application is bump interconnect lithography, which involves the formation of conductive (e.g., a gold or solder alloy or other suitable metal) bumps on a workpiece (wafer) that are used to contact circuit lines on a circuit board. Bump lithography includes an electrochemical plating step to form the conductive bumps. This step requires contacting most of the edge of the wafer with an electrode. Further, the thickness of the resist layer used in bump lithography is relatively thick (e.g., 50 microns) as compared to so-called "front-end" lithography. For bump lithography, substantially all of the edge of the wafer must be free of photoresist to ensure a uniform electrical contact.

When one-to-one contact or near-contact photolithography is performed, the entire wafer is exposed at once and the exclusion of the edge is achieved by incorporating the desired exclusion region into the reticle. Contact or near contact lithography for 200 or 300 mm wafers is limited by defects and large, expensive masks and mask contamination. Step-and-repeat lithography eliminates these disadvantages, though in many instances the exposure overlaps the edge of the wafer in situations where it is preferable not to expose at or near the edge of the wafer. In step and repeat photolithography, however, it is not possible to define an exclusion area into the reticle since the stepping pattern depends on the pattern size and the step sizes. There is therefore a need for a method and apparatus for defining an exposure exclusion region on a workpiece for certain photolithographic processes. The present invention provides such a method and apparatus.

SUMMARY OF THE INVENTION

The present invention relates to the lithographic exposure and patterning of workpieces using either reduction or 1× step and repeat lithography, and in particular relates to a mechanical method and apparatus for selectively masking a workpiece to prevent exposure of select regions on the workpiece.

A first aspect of the present invention is method of forming one or more exposure exclusion regions on a photosensitive workpiece to be exposed with an imaging system capable of forming microscopic features on the workpiece. The method includes selecting one or more macroscopic regions of the photosensitive workpiece surface to remain unexposed, and then masking the one or more select macroscopic regions of the workpiece. This is accomplished by arranging a mask proximate (i.e., on or near) the workpiece surface, the mask being opaque to a wavelength of radiation that activates the photosensitive workpiece. After exposing the workpiece, the mask is removed and the workpiece processed. When negative photoresist is used, the portion of the photoresist associated with the exposure exclusion region is removed upon processing so that the surface of the workpiece is accessible.

A second aspect of the present invention is an apparatus for forming one or more select exposure exclusion regions on a photosensitive workpiece. The apparatus includes a mask opaque to the wavelengths of radiation that activate the photosensitive workpiece. The mask is arranged proximate the photosensitive workpiece so as to cover select macroscopic regions of the workpiece. In a preferred embodiment, the mask is a ring sized to cover an (annular) region of the workpiece adjacent an edge of the workpiece. The apparatus may further include a mask handling system adapted to deliver the mask to and from the workpiece.

DETAILED DESCRIPTION OF THE INVENTION

The present invention relates to the lithographic exposure and patterning of workpieces, and in particular relates to a mechanical method and apparatus for selectively masking a workpiece to prevent exposure of select regions on the workpiece.

In the present invention, the term "mask" is used to distinguish the mechanical masking device of the present invention from a reticle (often also referred to as a "mask") that resides above the projection lens and that includes small patterns to be imaged onto the workpiece when performing front-end lithographic exposures (e.g., exposures that define the critical levels of a semiconductor device).

Figure 1:
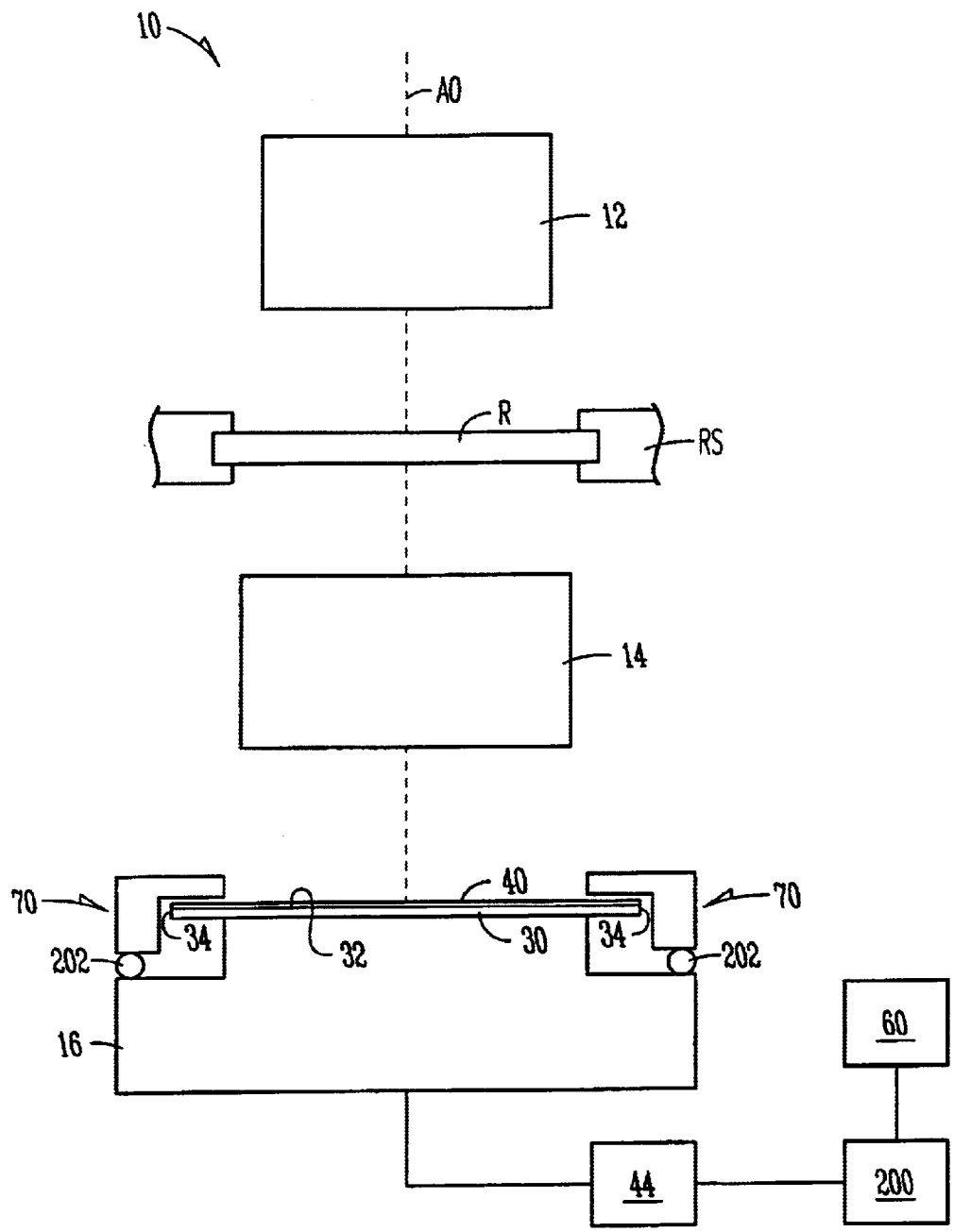
FIG. 1 is a schematic diagram of a lithography tool, including the mask of the present invention arranged relative to the workpiece.

With reference now to FIG. 1, there is shown a standard lithography tool 10 that includes in order along an axis A0, an illumination system 12, a reticle R supported by a reticle stage RS, a projection lens 14, and a workpiece stage 16 that movably supports a workpiece 30 to be exposed with images of reticle R. Workpiece 30 includes an upper surface 32 and an edge 34. Workpiece stage 16 is designed to movably support workpiece 30 beneath projection lens 14. Workpiece 30 is secured to the workpiece stage by vacuum prior to initiating movement of the workpiece stage.

Workpiece 30 is moved beneath the projection lens by workpiece stage 16 so that multiple exposure fields 36 (FIG. 2) can be lithographically formed (exposed) on the workpiece. In an example embodiment of the present invention, upper surface 32 of workpiece 30 is photosensitive and includes a layer of negative-tone photoresist 40, which typically has a thin-film protective coating (not shown). An example of a negative-tone photoresist suitable for use in the present invention is RISTON® manufactured by DUPONT. RISTON® includes a thin MYLAR® coating that is transparent to the exposure radiation wavelength.

Lithography tool 10 includes a main controller 44 that controls the operation of the lithography tool, and that is operatively connected to workpiece stage 16 to control the pre-alignment and delivery of workpieces thereto. Main controller 44 also optionally controls and coordinates the mechanical masking method for forming one or more exposure exclusion regions over the workpiece (described in greater detail below), in conjunction with the lithographic exposure process that forms exposure fields 36.

Figure 3:
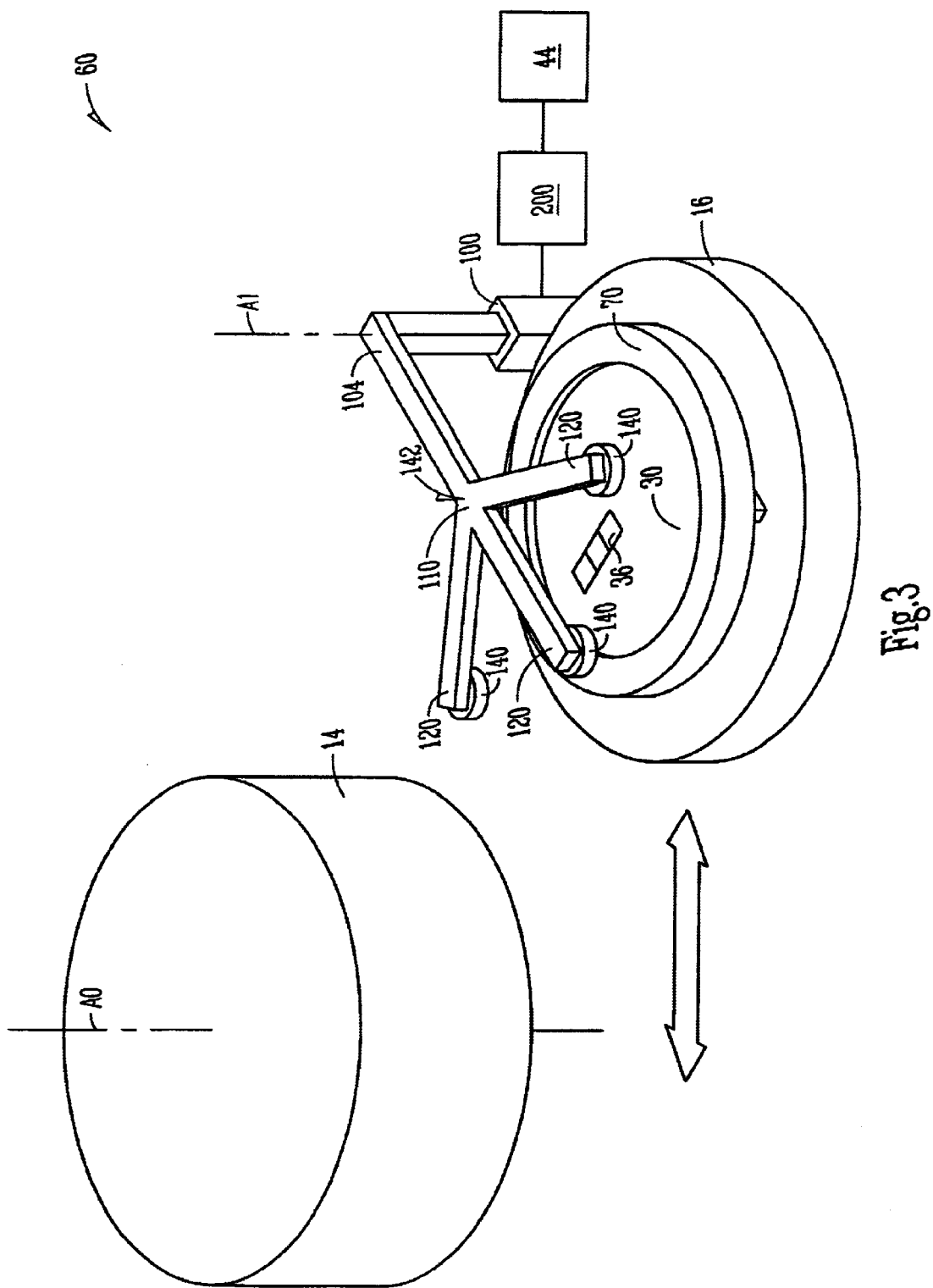
FIG. 3 is a perspective view of the workpiece stage of the lithography tool of FIG. 1 along with an example mask handling system operatively coupled thereto, wherein the workpiece stage is shown located in a workpiece load/unload position relative to the projection lens.

With reference now to FIG. 3, operatively coupled to workpiece stage 16 is a mask handling system 60 that is designed to handle (i.e., engage, transport and disengage) a workpiece mask 70 used to carry out the exposure exclusion method of as the present invention. In the present invention, mask 70 is such that the exposure exclusion regions defined thereby are macroscopic (i.e., on the order of 1 mm or greater) rather than microscopic (i.e., on the order of tens of microns or less). Further, the mask is preferably used in combination with a reticle and imaging system (e.g., tool 10) used to print mainly microscopic features on the workpiece. The present invention involves preventing the exposure of select macroscopic regions on the workpiece during lithographic printing.

Workpiece mask (hereinafter, simply "mask") 70 is an opaque member, at least a portion of which resides atop or near to photosensitive surface 32 of workpiece 30 (e.g., atop photoresist layer 40). Here, "opaque" means that the mask does not transmit substantial amounts of light at the wavelengths that activate the photosensitive surface (e.g., the photoresist) of workpiece 30. Where a negative photoresist layer 40 of RISTON® or other suitable dry film photoresist is used, mask 70 can sit directly upon the MYLAR® layer covering the resist.

Mask 70 may be made of almost any opaque material, and is preferably lightweight plastic or metal. In the case where mask 70 is handled using a magnetic-based handling system 60, then mask 70 is preferably metal to allow for magnetic handling. In the case where mask 70 is handled using a vacuum-based handling system 60, a non-conductive material such as plastic or paper can be used.

Figure 4:
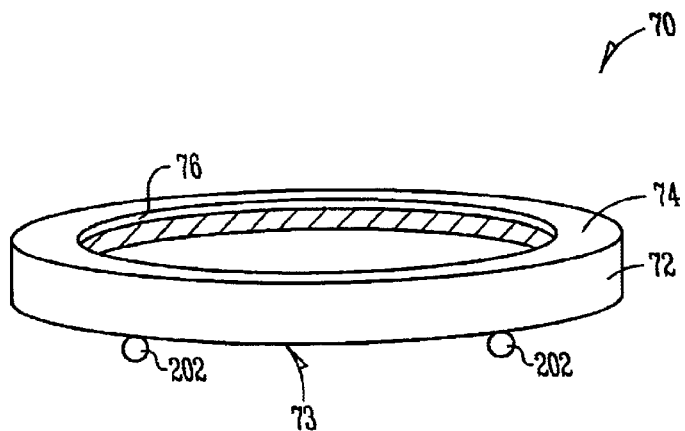
FIG. 4 is a perspective view of a ring mask suitable for use with a circular flat workpiece such as a typical semiconductor wafer.
Figure 5:
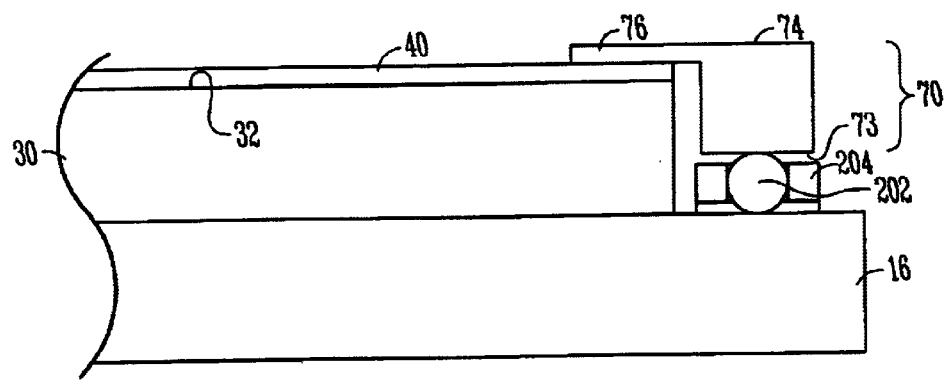
FIG. 5 is a close-up cross-sectional view of the ring mask of FIG. 4 arranged relative to a workpiece coated with a layer of photoresist and residing on the workpiece stage.

With reference now to FIGS. 4 and 5, in a preferred embodiment, mask 70 is in the form of a ring that includes a main body 72 with a lower surface 73 and an upper surface 74. Ring mask 70 further includes lip 76 that extends inwardly from body 72 at or near upper surface 74. In an example embodiment, lip 76 ranges from about 1 mm to about 5 mm in width. Further in an example embodiment, lip 76 of ring mask 70 may have a thickness ranging anywhere from about 5 mils to 15 mils and a radius from about 50 mm to about 150 mm The particular shape of mask 70 depends on the size of workpiece 30 and the shape of the desired exposure exclusion region to be formed. Preferably, an inventory of rings is kept available for use with different types workpieces. For many applications, such as bump lithography, standard-sized (e.g., 100 mm to 300 mm) wafers are used as workpieces so that only one or a few types of masks (e.g., several ring masks of different radii and widths) may be required.

With reference again to FIG. 3, in an example embodiment, mask handling system 60 includes a motorized base 100 from which extends a beam 104 having a distal end 110. Beam 104 can be raised or lowered at base 100, as well as rotated about an axis A1. Mounted to distal end 110 are arms 120 that extend outwardly therefrom. Each of arms 120 includes at one end a contact member 140 that is designed to contact and selectively engage mask 70. For example, contact members 140 may be vacuum pads that engage mask 70 with a vacuum strong enough to lift the mask. In another example, contact members 140 may be electromagnets that can be energized to engage and lift mask 70. In yet another example, contact members 140 may be retractable clips that can engage and lift mask 70. Thus, contact members 140 may be any number of devices known to be suitable for engaging and lifting mask 70. Arms 120 and the associated contact members 140 constitute a mask lifting member 142 that is raised and lowered to accurately place mask 70 onto the workpiece and to engage and lift the mask from the workpiece.

Mask handling system 60 preferably includes a mask handling control unit 200 connected to base 100 and that is also connected to main controller 44. Control unit 200 controls the engaging, precise delivery, and disengaging of mask 70 when masking and de-masking the workpiece. Control unit 200 may be independently programmable or be controlled by main controller 44 so that the photolithographic exposure process is coordinated with masking the workpiece.

Figure 6:
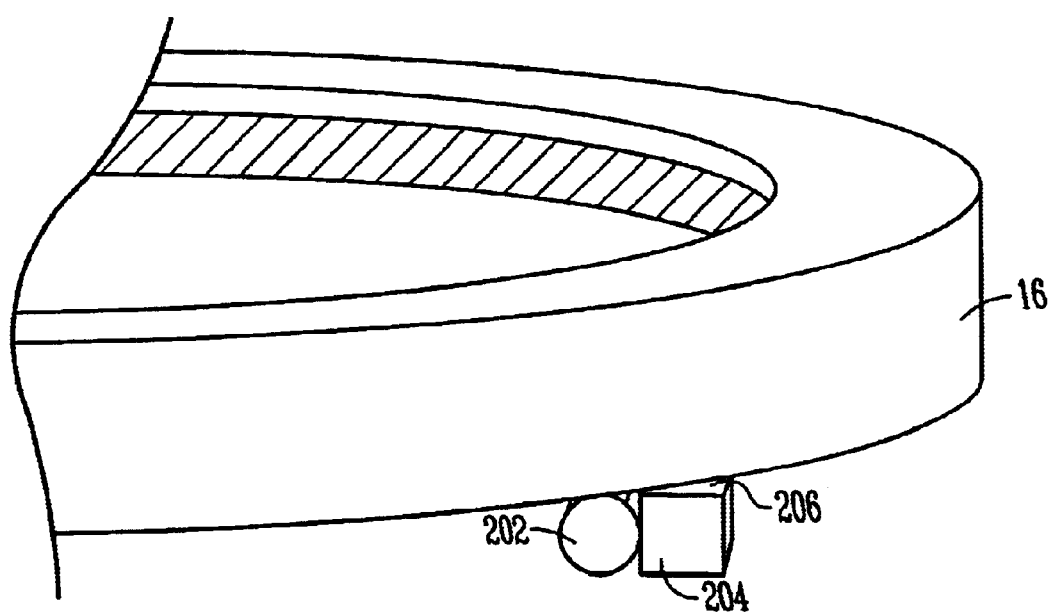
FIG. 6 is close-up top-down perspective view of the ring mask arranged as in FIG. 5 showing a constraining member on the workpiece stage surface engaging one of the balls of the ring mask.

With reference now to FIGS. 5 and 6, mask 70 is kinematically positioned with respect to the wafer chuck so that it is constrained in the workpiece plane by two or more balls 202 attached to the lower surface 73 of the ring and which are held against corresponding constraining members 204 arranged on workpiece stage 16. Constraining members 204 preferably have a v-groove 206 sized to engage ball 202. Constraining members 204 are designed to prevent lateral motion or rotation of mask 70 about a vertical axis while arranged proximate the workpiece. Freedom of motion in the vertical direction allows the mask ring to directly contact the top surface of resist layer 40 if desired.

Method of Operation

With continuing reference to FIG. 3, the method of creating an exposure exclusion region on workpiece 30 proceeds as follows. First a workpiece 30 is loaded onto workpiece stage 16, which is preferably moved from beneath projection lens 14 to a workpiece loading and unloading position, such as shown in FIG. 3. Next, the one or more regions of the photosensitive workpiece surface to remain unexposed (i.e., exposure exclusion regions) are decided upon and the appropriate mask 70 is selected.

Once a first workpiece 30 is properly arranged on workpiece stage 16, then mask handling system 60 is activated and instructed via control unit 200 to deliver the appropriate mask 70 to the workpiece. The mask, which may reside in a mask library (not shown), is engaged by mask lifting member 142. The mask is then placed proximate workpiece upper surface 32 and aligned relative to the workpiece so that the regions to be excluded from exposure are covered by the mask. Whether mask 70 contacts workpiece upper surface 32 or resides immediately above may be dictated by the size of body region 72 and/or balls 202.

Figure 7:
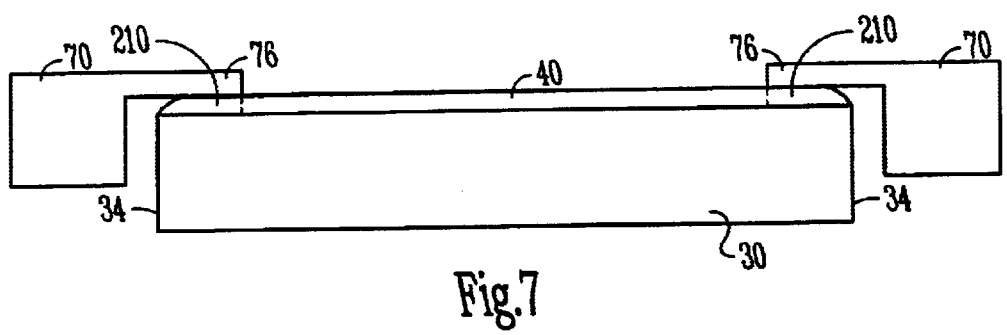
FIG. 7 is a cross-sectional view of the ring mask of FIG. 5 positioned proximate the photoresist layer of a workpiece to form a ring-type exposure exclusion region adjacent the edge of the workpiece.

As discussed above, alignment of mask 70 may be accomplished by engaging one or more balls 202 fixed to the mask with constraining members 204 fixed to the workpiece stage (FIG. 6). For example, with reference to FIG. 7, where mask 70 is a ring mask and the desired exposure exclusion region 210 is annular and adjacent edge 34 of the workpiece, then the mask is arranged and aligned such that mask lip 76 covers the portion of workpiece surface 32 near edge 34 of workpiece 30.

With reference again to FIG. 3, once mask 70 is set in place, workpiece stage 16 then moves back to beneath projection lens 14 to an exposure position. At this point, alignment and focus of the workpiece are performed in anticipation of exposing the workpiece. These processes may need to be suitably modified if it proves that the addition of mask 70 to the workpiece interferes with the focus and/or the alignment systems (not shown) of lithography tool 10. Further, main controller 44 may need to be informed of the presence or absence of mask 70 so that it can, if necessary, alter the operation of the lithography tool 10 to accommodate the mask.

Figure 2:
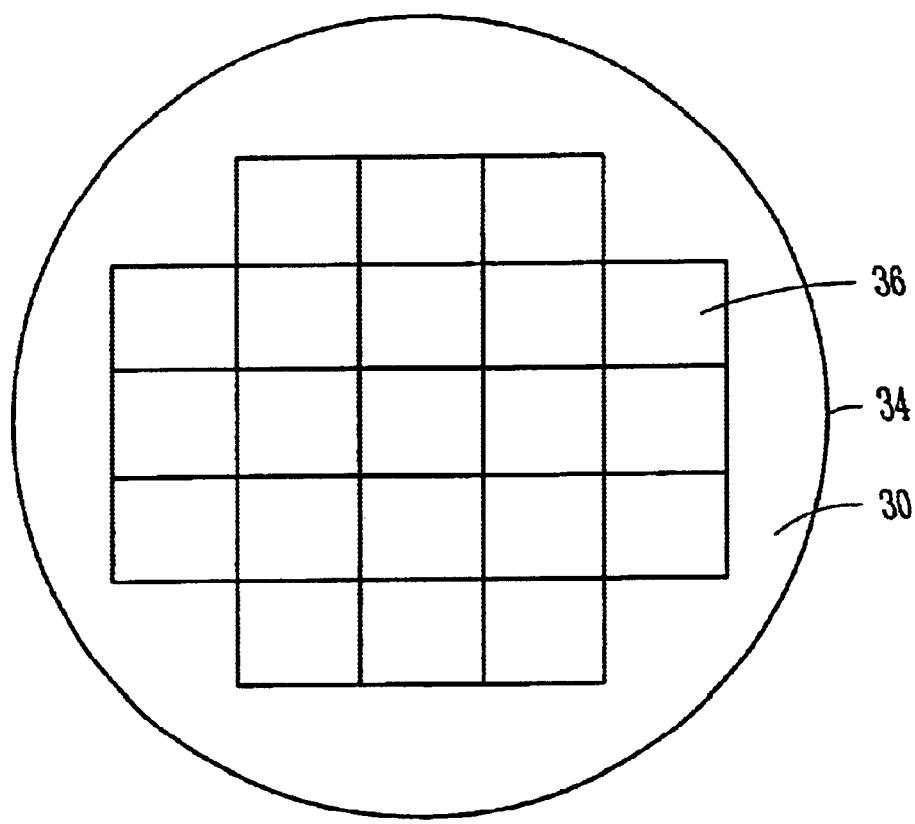
FIG. 2 is a plan view of a workpiece showing exposure fields formed on the photosensitive surface of the workpiece.

Once the masked workpiece 30 is arranged in position beneath projection lens 14, then the masked workpiece is lithographically exposed one or more times to create one or more exposure fields 36 (FIG. 2). This exposure process may involve, for example, forming bump interconnections for bump lithography. Once masked, workpiece 30 is exposed, then workpiece stage 16 is moved to the workpiece loading and unloading position. Control unit 200 then activates mask handling system 60 so that mask lifting member 142 can engage and lift mask 70 from workpiece 30.

Figure 8:
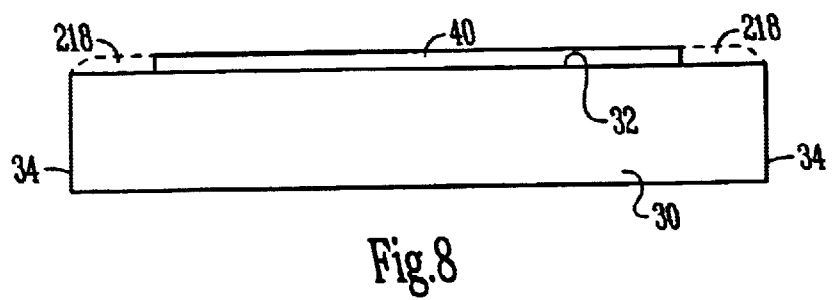
FIG. 8 is a cross-sectional diagram similar to FIG. 7 after the workpiece has been processed, illustrating the removal of the portion of the photoresist layer corresponding to the ring-type exposure exclusion region.

With reference to FIG. 8, masking workpiece 30 with a ring mask 70 results in a portion 218 (dashed line) of a negative-tone photoresist layer 40 being removed from the workpiece upon processing (e.g., developing) that corresponds to exposure exclusion region 210. This allows for electrical contact to be made directly with the workpiece upper surface 32 at or near edge 34. Such contact, as mentioned above, is necessary in certain photolithography applications such as bump lithography.

Once mask 70 is removed by mask handling system 60, the first workpiece can be unloaded from workpiece stage 16 and a new (second) workpiece delivered to the workpiece stage for masking and subsequent lithographic processing.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. A method for forming an edge exposure exclusion region on a surface of a photosensitive workpiece, the method comprising the steps of:
   a. loading the workpiece onto a moveable stage in a loading area that is displaced from a workpiece exposure location;
   b. following step a., placing a mask that encircles the entire edge region of the surface of the workpiece on the stage, the mask being opaque to a wavelength of radiation that activates the photosensitive workpiece;
   c. moving the stage to the exposure location where a projection and illumination system is disposed above the surface of the workpiece with the mask in place;
   d. exposing the workpiece and mask with radiation from the projection and illumination system to print microscopic features on the unmasked surface of the workpiece while leaving the edge of the workpiece unexposed;
   e. moving the stage to the loading area; and
   f. removing the mask from the stage in the loading area; wherein said unexposed edge of the workpiece is said edge exposure exclusion region.

2. A method according to claim 1, wherein the mask is in the form of a ring and in step b. the ring is placed adjacent the surface of the workpiece.

3. A method according to claim 1:
   wherein the steps of placing and removing the mask are each performed with a mask handling system having vacuum contacts.

4. A method according to claim 1 wherein: the mask is made of a magnetically conductive material; the method further includes the step of:
   g. prior to step a., delivering the mask to the loading area; and
   steps g. and f. are each performed with a mask handling system having magnetic contacts.

5. A method according to claim 1 wherein step d. is performed with a lithographic tool.

6. A method according to claim 1 further includes the steps of:

g. prior to step a., coating the workpiece with negative photoresist to form the photosensitive workpiece; and h. following step f., processing the workpiece to remove the negative photoresist from the edge of the workpiece.

7. A method of claim 1 further including the step of:

g. prior to step a., moving the stage to the loading area.

8. A method of claim 1 wherein step b. includes the step of:

g. engaging the mask with one or more constraining members on the stage that fix the mask to an aligned position relative to the surface of the workpiece.

9. An apparatus to form an edge macroscopic exposure exclusion region on a surface of a workpiece with a photosensitive surface coating, comprising:

a moveable stage transportable between a loading area and an exposure location, the stage disposed to receive the workpiece in the loading area and to retain the workpiece thereon;

a mask, opaque to wavelengths of radiation that activate the photosensitive surface coating of the workpiece, disposed to be placed on the stage when in the loading area after the loading of the workpiece, proximate an edge of the surface of the workpiece and sized and shaped to encircle and cover the edge of the workpiece, and to be retained on the stage; and a radiation source, in the exposure location disposed to direct radiation to said workpiece and said mask to print microscopic features on the workpiece while leaving an unexposed edge of the workpiece when the stage is in the exposure location;

wherein said unexposed edge is said edge macroscopic exposure exclusion region, and said loading area and exposure location are physically separated from each other.

10. An apparatus according to claim 9, wherein the mask is a ring adapted to cover a ring-shaped region of the workpiece adjacent an edge of the workpiece.

11. An apparatus according to claim 10, wherein the ring includes an annular body with an inwardly protruding lip.

12. An apparatus according to claim 11, wherein the lip has a thickness of between 0.1 mm and 0.4 mm.

13. An apparatus according to claim 10, wherein the ring-shaped region of the workpiece covered by the ring mask has a width of between 1 mm and 5 mm.

14. An apparatus according to claim 9, further including a mask handling system in the loading area adapted to deliver and remove the mask to and from the workpiece.

15. An apparatus according to claim 14, wherein the mask is made of a magnetically conductive material so that it can be magnetically handled during placement and removal to and from the workpiece.

16. An apparatus according to claim 15, wherein the ring has a radius of between 50 mm and 150 mm.

* * * * *